United States Patent
Park et al.

(10) Patent No.: US 9,843,758 B2
(45) Date of Patent: Dec. 12, 2017

(54) DISPLAY APPARATUS AND CONTROL METHOD FOR THE SAME

(71) Applicant: SAMSUNG ELECTRONICS CO., LTD., Suwon-si (KR)

(72) Inventors: Jae Hoo Park, Suwon-si (KR); Dae Sung Ko, Seoul (KR); Sung Soo Jung, Suwon-si (KR); Jin Jung, Hwaseong-si (KR); Gyu Sung Do, Seoul (KR); Jeong Roh Lee, Hwaseong-si (KR)

(73) Assignee: SAMSUNG ELECTRONICS CO., LTD., Suwon-Si (KR)

(*) Notice: Subject to any disclaimer, the term of this patent is extended or adjusted under 35 U.S.C. 154(b) by 0 days.

(21) Appl. No.: 14/337,502

(22) Filed: Jul. 22, 2014

(65) Prior Publication Data

US 2015/0029166 A1    Jan. 29, 2015

(30) Foreign Application Priority Data

Jul. 25, 2013 (KR) .................. 10-2013-0088071
Aug. 1, 2013 (KR) .................. 10-2013-0091536
Dec. 20, 2013 (KR) .................. 10-2013-0160685

(51) Int. Cl.
    *G09G 5/00*      (2006.01)
    *H04N 5/44*      (2011.01)
    (Continued)

(52) U.S. Cl.
    CPC ......... *H04N 5/4403* (2013.01); *G06F 1/1601* (2013.01); *G06F 1/1641* (2013.01);
    (Continued)

(58) Field of Classification Search
    CPC ...... G09G 3/20; G09G 3/3208; G09G 3/3648; G09G 2320/0606; G09G 2380/02;
    (Continued)

(56) References Cited

U.S. PATENT DOCUMENTS 4,601,514 A * 7/1986 Meiller .................. A47C 7/462
                                                                                 297/284.4
5,174,526 A * 12/1992 Kanigowski ............. B60N 2/66
                                                                                  244/118.5

(Continued)

FOREIGN PATENT DOCUMENTS

| JP | 2006023676 A | 1/2006 |
| JP | 2009109812 A | 5/2009 |
| WO | 2010041227 A1 | 4/2010 |

OTHER PUBLICATIONS

Communication dated Nov. 3, 2014, issued by the International Searching Authority in counterpart International Application No. PCT/KR2014/006819.

(Continued)

Primary Examiner — Christopher E Leiby
(74) Attorney, Agent, or Firm — Sughrue Mion, PLLC

(57) ABSTRACT

Disclosed herein is a display apparatus that uses a display module by selectively setting the display module to a flat surface form and a curved surface form. The display apparatus includes a display module that is bendable and is configured to display an image, and a bending structure configured to deform the display module by moving at least one of a center and both ends of the display module relative to each other to form one of a flat surface form and a curved surface form of the display module.

34 Claims, 16 Drawing Sheets

(51) Int. Cl.
 *G06F 1/16* (2006.01)
 *G09G 3/20* (2006.01)
 G09G 3/3208 (2016.01)
 G09G 3/36 (2006.01)
 H05K 1/18 (2006.01)

(52) U.S. Cl.
 CPC ............. *G06F 1/1652* (2013.01); *G09G 3/20* (2013.01); *G06F 2200/1612* (2013.01); *G09G 3/3208* (2013.01); *G09G 3/3648* (2013.01); *G09G 2320/0606* (2013.01); *G09G 2380/02* (2013.01); *H05K 1/189* (2013.01); *H05K 2201/10128* (2013.01)

(58) Field of Classification Search
 CPC ........ H04N 5/4403; H04N 5/64; H05K 1/189; H05K 2201/10128; G06F 1/1652; G06F 1/1626; G06F 1/1601; G06F 1/1613; G06F 1/1633; G06F 2200/1612; G02F 1/133305; G09F 9/301
 See application file for complete search history.

(56) References Cited

U.S. PATENT DOCUMENTS

| | | | | |
|---|---|---|---|---|
| 9,081,540 B1* | 7/2015 | Cho | .................. | G06F 1/1601 |
| 9,116,662 B1* | 8/2015 | Song | .................. | G06F 1/1601 |
| 9,123,290 B1* | 9/2015 | Cho | .................. | G06F 1/1652 |
| 2006/0107566 A1* | 5/2006 | Van Rens | ............... | G09F 9/35 |
| | | | | 40/515 |
| 2006/0213281 A1* | 9/2006 | Doak | ................. | G01N 3/20 |
| | | | | 73/849 |
| 2007/0146616 A1 | 6/2007 | Nouchi et al. | | |
| 2008/0178501 A1 | 7/2008 | Crowell et al. | | |
| 2010/0277860 A1* | 11/2010 | Jeong | ................. | H04M 1/0216 |
| | | | | 361/679.27 |
| 2011/0043976 A1* | 2/2011 | Visser | ..................... | G09F 9/00 |
| | | | | 361/679.01 |
| 2011/0095975 A1* | 4/2011 | Hwang | .............. | G06F 1/1626 |
| | | | | 345/156 |
| 2013/0010405 A1* | 1/2013 | Rothkopf | ............ | H04M 1/0216 |
| | | | | 361/679.01 |
| 2013/0114193 A1* | 5/2013 | Joo | ................... | F16M 11/08 |
| | | | | 361/679.01 |
| 2013/0155655 A1* | 6/2013 | Lee | ..................... | H05K 5/03 |
| | | | | 362/97.1 |
| 2013/0207946 A1* | 8/2013 | Kim | .................. | G09G 3/3225 |
| | | | | 345/204 |
| 2013/0329422 A1* | 12/2013 | Park | ................... | G02F 1/133305 |
| | | | | 362/233 |
| 2014/0198465 A1* | 7/2014 | Park | ..................... | H05K 5/0226 |
| | | | | 361/749 |
| 2014/0226266 A1* | 8/2014 | Kang | ................. | H01L 51/0097 |
| | | | | 361/679.01 |
| 2014/0240906 A1* | 8/2014 | Seo | ........................ | A47B 81/06 |
| | | | | 361/679.01 |
| 2014/0314999 A1* | 10/2014 | Song | ..................... | G06F 1/1601 |
| | | | | 428/174 |
| 2015/0009635 A1* | 1/2015 | Kang | ..................... | G09F 9/301 |
| | | | | 361/749 |
| 2015/0035812 A1* | 2/2015 | Shin | ..................... | G09G 3/3688 |
| | | | | 345/204 |
| 2015/0043136 A1* | 2/2015 | Kim | .................. | G02F 1/133305 |
| | | | | 361/679.01 |
| 2015/0092361 A1* | 4/2015 | Cho | ....................... | H05K 1/028 |
| | | | | 361/749 |
| 2015/0124193 A1* | 5/2015 | Yoshikawa | ........ | G02B 26/0825 |
| | | | | 349/60 |
| 2015/0185761 A1* | 7/2015 | Song | ..................... | G06F 1/1601 |
| | | | | 361/679.21 |
| 2015/0192952 A1* | 7/2015 | Jung | ..................... | G06F 1/1601 |
| | | | | 361/747 |

OTHER PUBLICATIONS

Communication dated Sep. 13, 2016, issued by the European Patent Office in counterpart European Application No. 14830105.4.
Communication issued Aug. 8, 2017 by the European Patent Office in counterpart European Patent Application No. 14830105.4.

* cited by examiner

DISPLAY APPARATUS AND CONTROL METHOD FOR THE SAME

CROSS-REFERENCE TO RELATED APPLICATIONS

This application claims the benefit of Korean Patent Application No. 10-2013-0088071 filed on Jul. 25, 2013 in the Korean Intellectual Property Office, Korean Patent Application No. 10-2013-0091536 filed on Aug. 1, 2013 in the Korean Intellectual Property Office, and Korean Patent Application No. 10-2013-0160685 filed on Dec. 20, 2013 in the Korean Intellectual Property Office, the disclosures of which are incorporated herein by reference in their entireties.

BACKGROUND

1. Field

Apparatuses and methods consistent with exemplary embodiments relate to a display apparatus which allows a display module to be used selectively in a flat surface form or a curved surface form and a control method for the same.

2. Description of the Related Art

A display apparatus generally includes a display module on which images are displayed. Examples of the display apparatus include a television and a monitor. A display apparatus may be implemented using a plurality of different technologies such as, for example, an organic light emitting diode panel.

The organic light emitting diode panel may be formed of a material that may be bendable within a specific range. Accordingly, a display apparatus with a display panel fixedly installed in a curved surface form which may produce three-dimensional effects with a two-dimensional image for a user has been recently proposed.

However, there may be some users who may prefer the flat surface form to the curved surface form of the display module.

In addition, the display module arranged in the curved surface form may enhance a sense of immersion in the case that there is only one viewer. However, in the case that there are multiple viewers, such display module may cause inconvenience because the viewing angle may be limited.

Further, a display panel in the flat surface form may deliver a more accurate image than a display panel in the curved surface form. Accordingly, for certain kinds of content, a display panel shaped in the flat surface form may provide different advantages as compared to when the display panel is in the curved surface form.

SUMMARY

According to an aspect of an exemplary embodiment, there is provided a display apparatus including a display module that is bendable and is configured to display an image, and a bending structure configured to deform the display module by moving at least one of a center and both ends of the display module relative to each other to form one of a flat surface form and a curved surface form of the display module.

The bending structure may include a frame arranged at a back of the display module, a wire provided laterally along the frame, and a tension adjuster configured to adjust tension of the wire.

The bending structure may cause the center of the display module to move backward relative to both ends into a concave shape along with the wire into the curved surface form according to decreased tension on the wire.

The bending structure may cause the center of the display module to move forward relative to both ends along with the wire from a concave shape into the flat surface form according to increased tension on the wire.

The frame may include a link unit including a plurality of link members configured to support a rear surface of the display module, a plurality of hinges configured to connect the plurality of link members to each other, and a plurality of elastic members disposed adjacent to the plurality of hinges and configured to move the link members into the curved surface form.

The link unit may include a first link unit arranged laterally along an upper end of the display module, and a second link unit arranged laterally along a lower end of the display module.

The frame may include a support member configured to connect the first link unit to the second link unit.

The wire may include a first wire configured to connect a first side end of the first link unit to a center of the first link unit, a second wire to connect a second side end of the first link unit to the center of the first link unit, a third wire to connect a third side end of the second link unit to a center of the second link unit, and a fourth wire to connect a fourth side end of the second link unit to the center of the second link unit.

The tension adjuster may include a tension adjustment roller connected to the wire, and a driver configured to rotate the tension adjustment roller adjusting tension of the wire.

The driver may include a first gear formed on the tension adjustment roller, a second gear configured to engage the first gear, and a motor configured to rotate the second gear.

The tension adjuster may further include a guide roller configured to guide the wire.

The driver may further include a controller configured to control driving of the motor.

The controller may be configured to communicate with a remote control.

The remote control may include a hot key configured to trigger transmission of a signal requesting the display module be deformed.

The bending structure may include a memory alloy wire configured to connect the display module to the frame and contract and expand according to characteristics of an applied power.

The bending structure may further include a bracket arranged at the back of the display module and formed in a curved shape, and a fixing structure configured to fix a center of the memory alloy wire such that the display module is pulled toward the bracket by flexible deformation of the memory alloy wire.

The fixing structure may include a first fixing member arranged on a rear surface of the display module, and a second fixing member arranged at the bracket.

The memory alloy wire may be connected to the first fixing member and the second fixing member.

The first fixing member may include a restricting protrusion protruding to allow the memory alloy wire to be fixed thereto.

The second fixing member may include a fixing portion configured to be connected to both ends of the memory alloy wire, and a guide configured to guide movement of the memory alloy wire through flexible deformation.

The bending structure may further include a power source connected to the memory alloy wire.

The bending structure may further include a latch configured to hold the display module in response to the memory alloy wire contracting.

The latch may include a protrusion protruding from a rear surface of the display module, and a catch member adapted to hold or release the protrusion.

According to an aspect of another exemplary embodiment, there is provided a method of controlling a display apparatus including a display apparatus, a bending structure, and a controller, the method including switching, using the bending structure, between a flat surface form and a curved surface form, and controlling, using the controller, the bending structure, according to a command input by a user.

The method may further include receiving the command input for operating the bending structure through a button disposed on one of a remote control and the display apparatus.

The method may further include varying a curvature of the display module in proportion to a pressing time of the button.

The method may further include varying a curvature of the display module stepwise according to a number of times the button is pressed.

According to an aspect of another exemplary embodiment, there is provided a method of controlling a display apparatus including a display module, a bending structure, and a controller, the method including determining, using the controller, a content type of an image to be displayed on the display module, and deforming the display module using the bending structure based on the content type of the image to be displays on the display module.

The method may further include receiving information about the content type as input from a user.

The method may further include receiving the information about the content type is through a button disposed on one of a remote control and the display apparatus.

The method may further include receiving the information about the content type is along with information about the image from an image transmitter transmitting the image.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
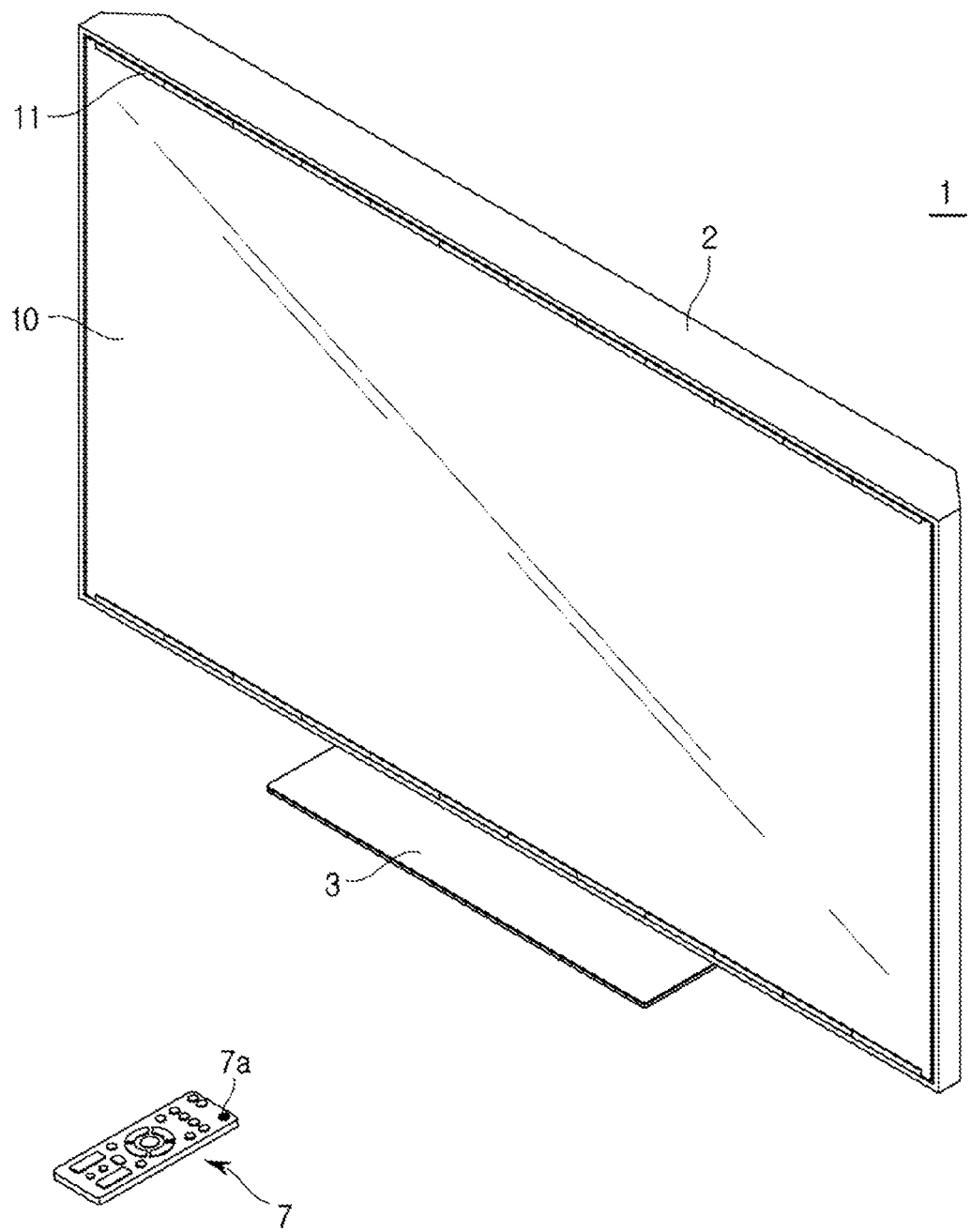
FIG. 1 is a perspective view schematically illustrating a display apparatus with a display module in a flat surface form according to an exemplary embodiment.

Reference will now be made in detail to the exemplary embodiments, examples of which are illustrated in the accompanying drawings, wherein like reference numerals refer to like elements throughout.

Figure 2:
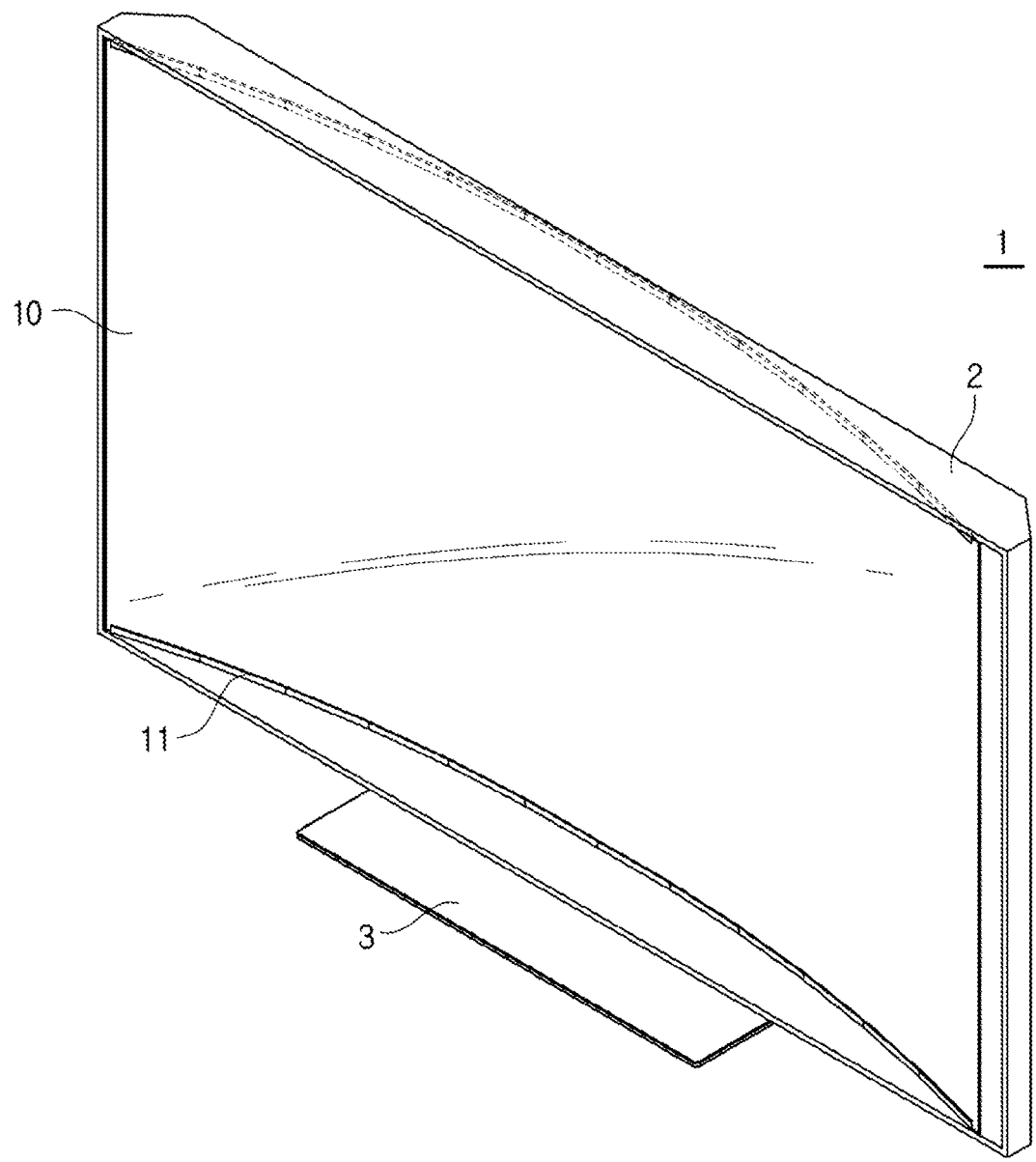
FIG. 2 is a perspective view schematically illustrating a display module of a display apparatus set in a curved surface form according to an exemplary embodiment.

FIG. 1 is a perspective view schematically illustrating a display apparatus with a display module in a flat surface form according to an exemplary embodiment. FIG. 2 is a perspective view schematically illustrating a display module of a display apparatus set in a curved surface form.

As shown in FIGS. 1 and 2, a display apparatus 1 includes a display module 10 to display image information and a case 2 disposed outside of the display module 10 to protect the display module 10 and the internal electronic components of the display module 10.

The display module 10 may include a display panel to display an image. The display panel may be formed by injecting liquid crystals between two glass plates including a thin film transistor (TFT) substrate and a color substrate. An image may be created on the display panel by causing the respective pixels to have different light emission states through a drive circuit arranged in a matrix form.

The case 2 may be formed to surround the rear surface and edges of the front surface of the display module 10. A power supply to supply electric power for driving of the display module 10 and a drive board to convert an externally supplied electrical signal into an image and sound may be arranged in the case 2.

A base 3 may be arranged below the case 2. The base 3 may be supported on an installation surface, e.g., a floor on which the display apparatus 1 is installed. According to another exemplary embodiment, the case 2 may be provided with a wall mount fixture on the back surface or along the edges of the case 2 instead of a base 3.

Further, the display apparatus may be controlled using a remote control 7 that may include a hot key 7a which may be programmed to trigger the display apparatus to move from a flat surface form as shown in FIG. 1 to a curved surface form as shown in FIG. 2. A fixing member 11, which may be located along an upper and a lower edge of the display module 10, may curve along with the display module 10 and may help to retain, or fix, the selected flat or curved form of the display module 10 within the case 2 of the display apparatus 1.

Further, according to another exemplary embodiment a user input triggering a change between the flat and curved forms may be received by the display apparatus using a camera sensor configured to receive a gesture, pose, or image from the user that indicates the selected form, or a microphone configured to receive an auditory command from a user selecting a form.

Figure 3:
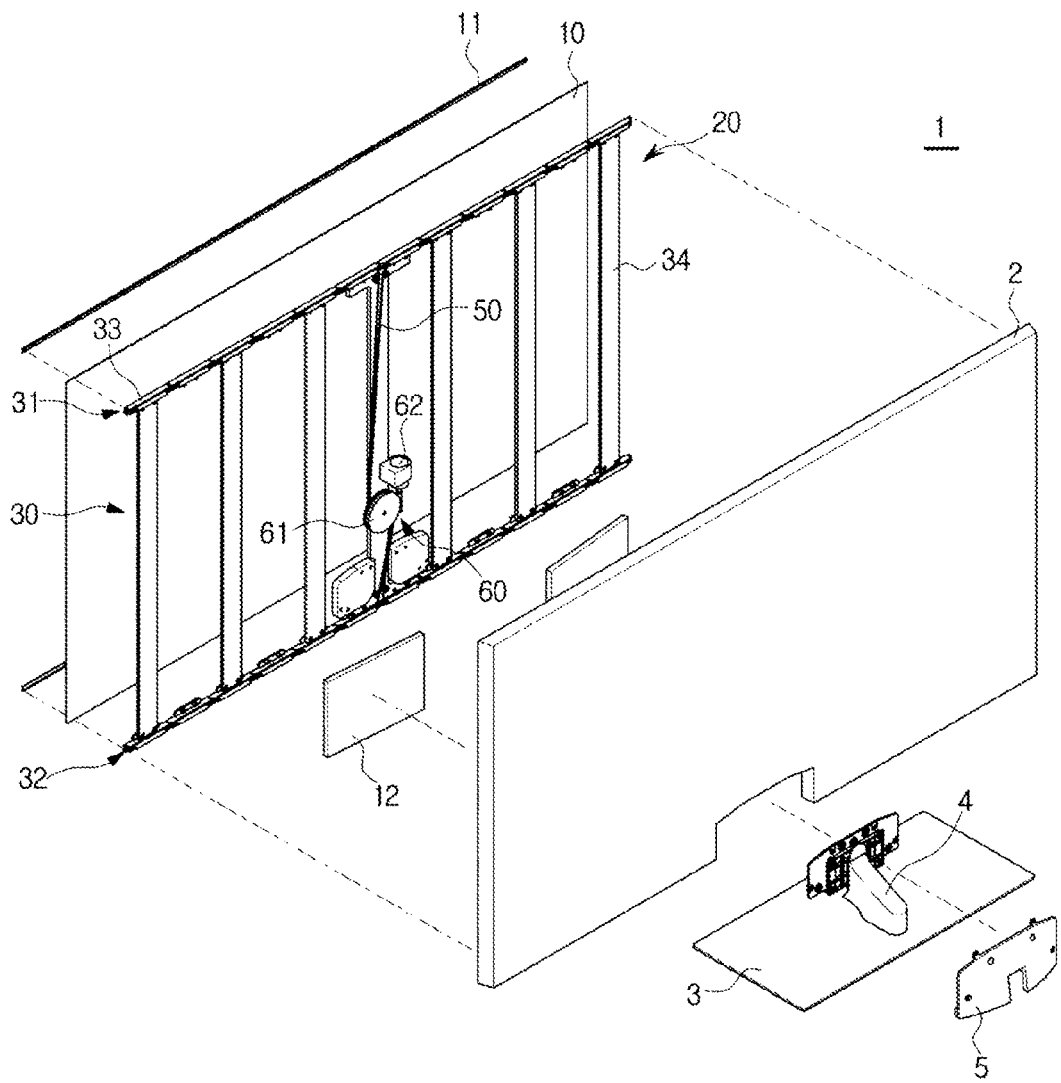
FIG. 3 is an exploded perspective view schematically illustrating a bending structure of a display apparatus according to an exemplary embodiment.

As shown in FIG. 3, the display module 10 and the base 3 may be connected to each other by a stand 4 set perpendicular to the base 3. The case 2 may be connected to the stand 4 of the base 3 through a cover 5.

The display apparatus 1 may include a bending structure 20 that deforms the display module 10 between the flat surface form and the curved surface form.

The bending structure 20 may include a frame 30 arranged at the back and outside of the display module 10, a wire 50 provided horizontally along the frame 30, and a tension adjuster 60 to adjust tension of the wire 50.

The frame 30 may be disposed between the display module 10 and the case 2 while remaining inside of the case 2. The wire 50 may be connected to the frame 30, and tension thereof may be adjusted through the tension adjuster 60.

In this exemplary embodiment, each of the display module 10 and the case 2 may be formed of a bendable material to be bent by the bending structure 20.

The bending structure 20 may bend the display module 10 to selectively set the display module 10 to a flat surface form, in which the display module 10 is arranged flat or to a curved surface form, in which both side ends of the display module 10 protrude forward beyond the center of the display module 10.

The change of the display module 10 between the flat surface form and the curved surface form may be implemented by operating the bending structure 20 with a remote control 7 configured to provide an input to the display apparatus 1 from a user. Alternatively, the remote control 7 may be implemented by an application on a user's smartphone, tablet, or laptop computer.

Alternatively, according to one or more exemplary embodiments, a controlling input may be provided by a gesture, pose, image, or audio signal from a user. Also the transition between the flat and curved forms may be programmed to occur at a designated time or dependent on the content being watched. Further, the display apparatus may detect the number of users and set a form to correspond to that detection. Further, according to an exemplary embodiment, content generators may be able to select transitioning between the forms dependent on a desired effect during certain parts of the content being viewed.

Herein, the remote control 7 may be provided with a hot key 7a allowing selection of the curved surface form and flat surface form of the display module 10. In this exemplary embodiment, a hot key 7a is exemplarily illustrated as being provided on the remote control 7 to select between implementing the curved surface form and flat surface form of the display module 10. However, exemplary embodiments are not limited thereto. For example, it may also be possible to select the curved surface form and flat surface form of the display module 10 using a menu key on the remote control 7.

Figure 4:
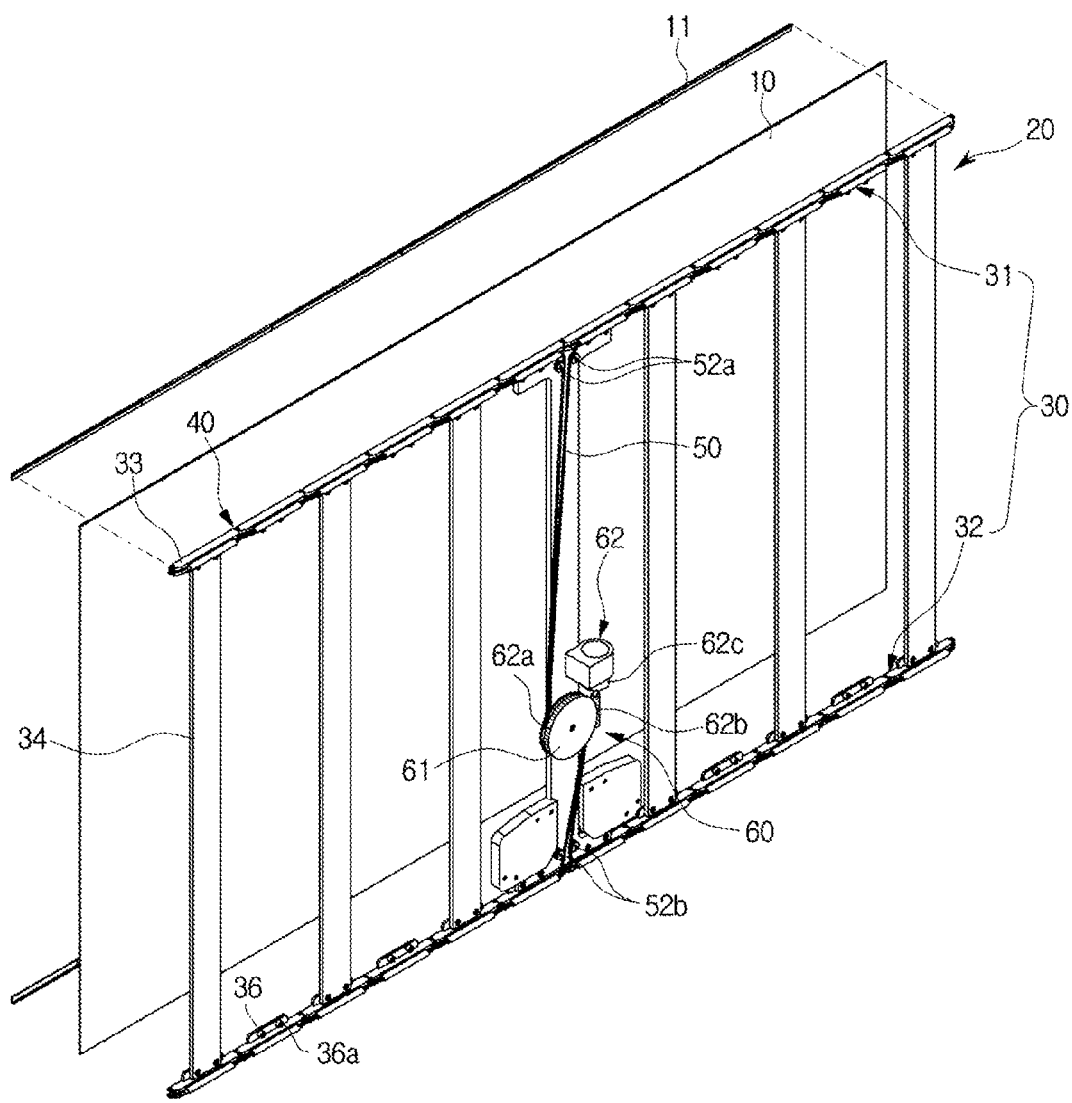
FIG. 4 is a view schematically illustrating a frame of a display apparatus according to an exemplary embodiment.
Figure 5:
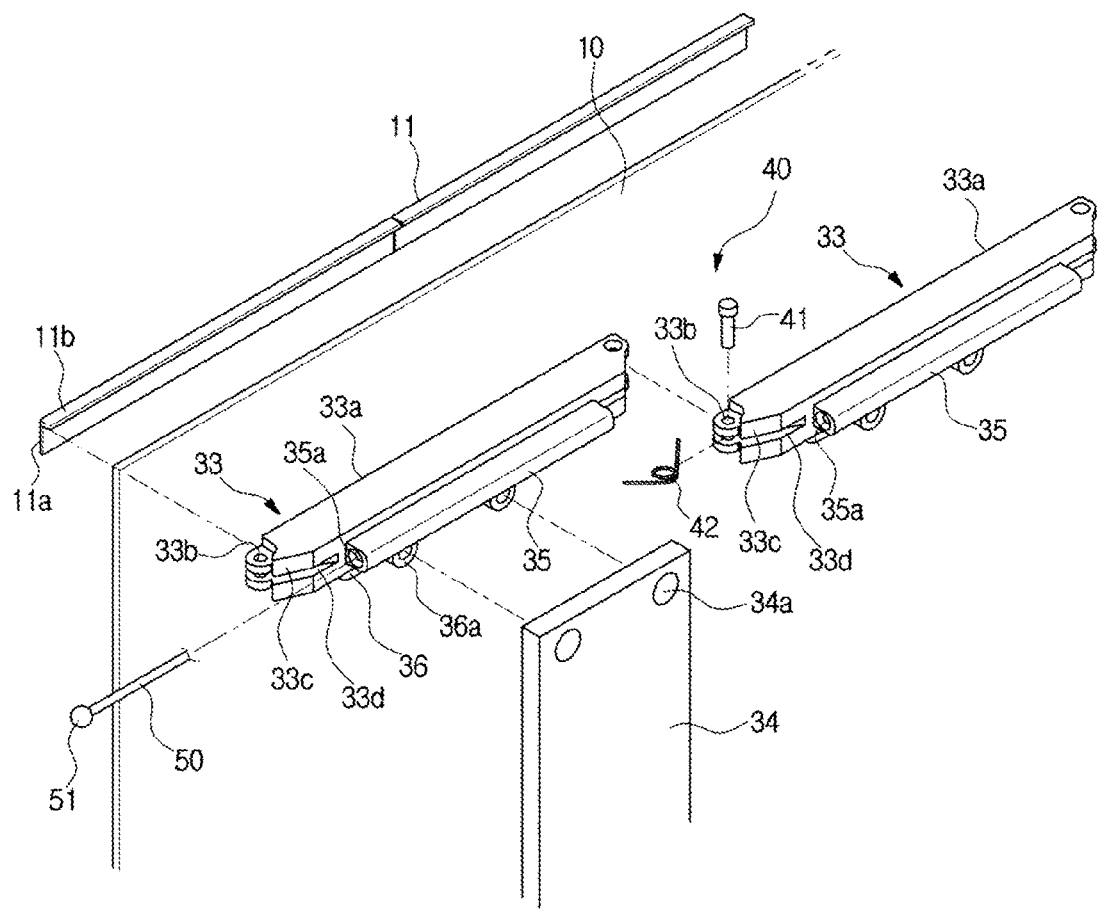
FIG. 5 is a view schematically illustrating a hinge of a frame according to an exemplary embodiment.

FIG. 3 is an exploded perspective view schematically illustrating a bending structure of a display apparatus according to an exemplary embodiment. FIG. 4 is a view schematically illustrating a frame of a display apparatus according to an exemplary embodiment. FIG. 5 is a view schematically illustrating a hinge of a frame according to an exemplary embodiment.

As shown in FIGS. 3 to 5, the bending structure 20 includes a frame 30 provided at the back of the display module 10 to move both side ends of the display module 10 forward relative to the center of the display module, a wire 50 provided along the frame 30, and a tension adjuster 60 to adjust tension of the wire 50.

The frame 30 includes link units 31 and 32 provided with a plurality of link members 33 adapted to support the rear surface of the display module 10, a hinge 40 to connect the link members 33 to each other, and an elastic member 42 to elastically separate the link members 33.

The link units 31 and 32 may include a first link unit 31 laterally disposed at the upper end of the display module 10 and a second link unit 32 laterally disposed at the lower end of the display module 10.

The frame 30 may further include at least one support member 34 to connect the first link unit 31 to the second link unit 32. The support member 34 may be disposed to extend along the vertical direction of the display module 10. Thereby, the support member may stably support the display module 10 when the display module 10 is bent, and maintain a uniform curvature at the upper and lower portions of the display module 10. In this exemplary embodiment, seven support members 34 are provided, among which two sets of three support members are disposed on the left and right sides of the center of the frame to correspond to each other. However, exemplary embodiments are not limited thereto.

A printed circuit board (PCB) 12 may be installed at the support members 34 of the frame 30. The PCB 12 may be formed of a bendable material to be flexibly bent when the display module 10 is bent. In this exemplary embodiment, the PCB 12 is separated into three parts and installed at the lower portion of the support members 34. Exemplary embodiments are not limited thereto. For example, the PCB 12 may be applied as one whole part and disposed at the center of the rear surface of the display module 10. Further, according to another exemplary embodiment, the PCB 12 may be shaped in a similar fashion to a support member and placed then mounted onto one of the support members.

Each of the link members 33 may include an attachment surface 33a formed on the front surface of each link member so as to be attached or fixed to the rear surface of the display module 10, hinge holes 33b formed at both ends of each link member to allow installation of a hinge shaft 41, a wire installation portion 35 through which the wire 50 may be connected, and a support member fixing portion 36 formed along the lower edge of each link member so as to be coupled to the support member 34.

The attachment surface 33a of each link member 33 may be adapted to be attached to the rear surface of the display module 10 and may be fixed to the display module 10 through a fixing member 11.

The fixing member 11 is approximately formed in an inverted L shape. The fixing member 11 may include a front surface part 11a to contact the upper and lower ends of the front surface of the display module 10, and a supporter 11b arranged in contact with and supported by the top and bottom surfaces of the display module 10 and the top surfaces of the link members 33.

Accordingly, each of the link members 33 may be fixed to the display module 10 by the corresponding fixing member 11.

The hinge hole 33b formed at both ends of each of the link members 33 may be provided with an inclined portion 33c inclined at a predetermined angle such that the hinge shaft 41 is inserted into the hinge hole 33b to connect the link members 33 to each other and mutual interference between the link members 33 connected by the hinge hole 33b is prevented during rotation of the link members 33.

Both side ends of each of the link members 33 may be provided with the elastic member 42 to elastically separate the link members 33 arranged to be rotated about the hinge shaft 41.

The elastic member 42 applies force outwardly about the rotation axis of the hinge shaft 41 of the link member 33 such that the display module 10 maintains the curved surface form. Both side ends of the link members 33 may be provided with an elastic member installation portion 33d to allow installation of the elastic member 42.

Provided at the lower end of the link member 33 is the support member fixing portion 36 to which the support member 34 is attached, thereby connecting the first link unit 31 to the second link unit 32.

The support member fixing portion 36 may include a fixing protrusion 36a protruding rearward of the display module 10. Penetrated fixing holes 34a may be provided at the upper and lower ends of the support member 34 such that the fixing protrusion 36a of the support member fixing portion 36 is fixed. In this exemplary embodiment, the link members 33 and the support member 34 are exemplarily illustrated as being fixed by fitting the fixing protrusion 36a into the fixing hole 34a. However, exemplary embodiments are not limited thereto. For example, the support member fixing portion 36 of the link member 33 may be connected to the support member 34 by a separate member such as a bolt.

A wire installation portion 35 may be formed along the rear surface of the link members 33. the wire installation portion 35 may include a wire conduit 35a laterally extending through the wire installation portion 35 to allow the wire 50 to be seated therein.

The wire 50 installed through the wire conduit 35a allows the link members 33 to be horizontally connected along the upper end and lower end of the display module 10 to which the link members 33 are fixed.

Tension of the wire 50 connected to the frame 30 disposed at the upper and lower portions of the rear surface of the display module 10 may be adjusted by the tension adjuster 60.

Figure 6:
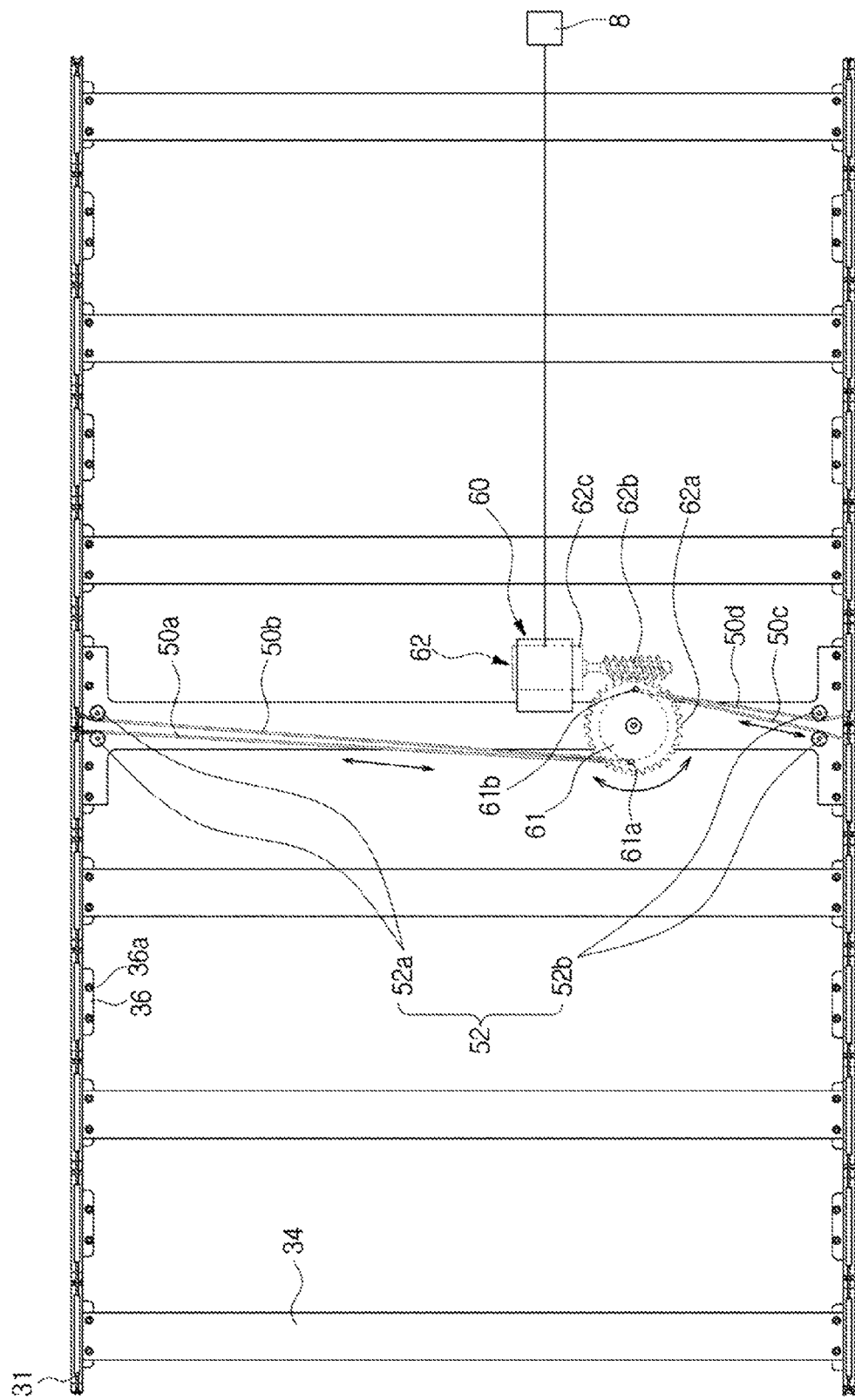
FIG. 6 is a view schematically illustrating a tension adjuster of a bending structure according to an exemplary embodiment.
Figure 7:
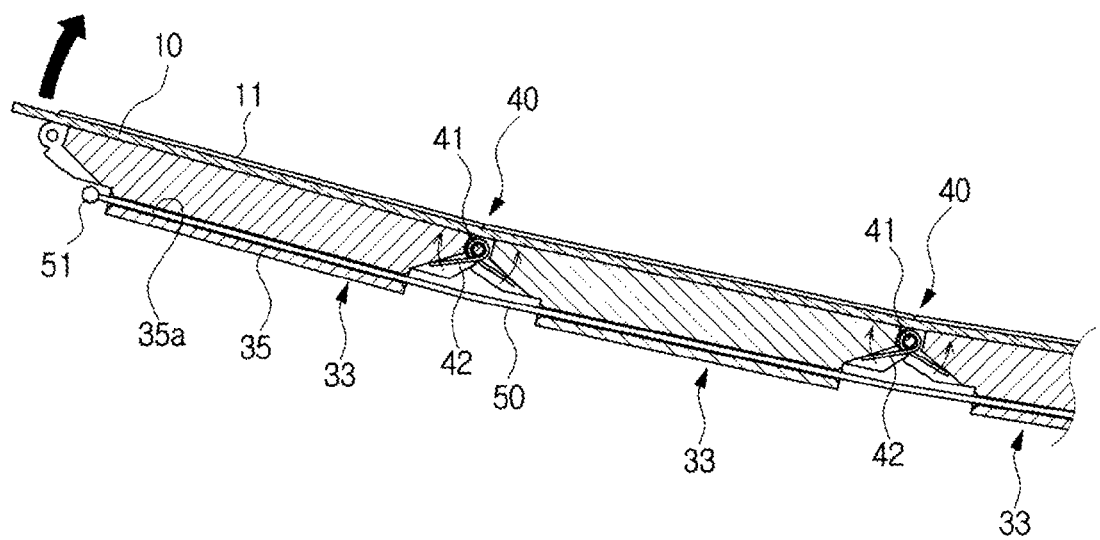
FIGS. 7 and 8 are views schematically illustrating positions of the display module operated by a tension adjuster of a bending structure according to one or more exemplary embodiments.
Figure 8:
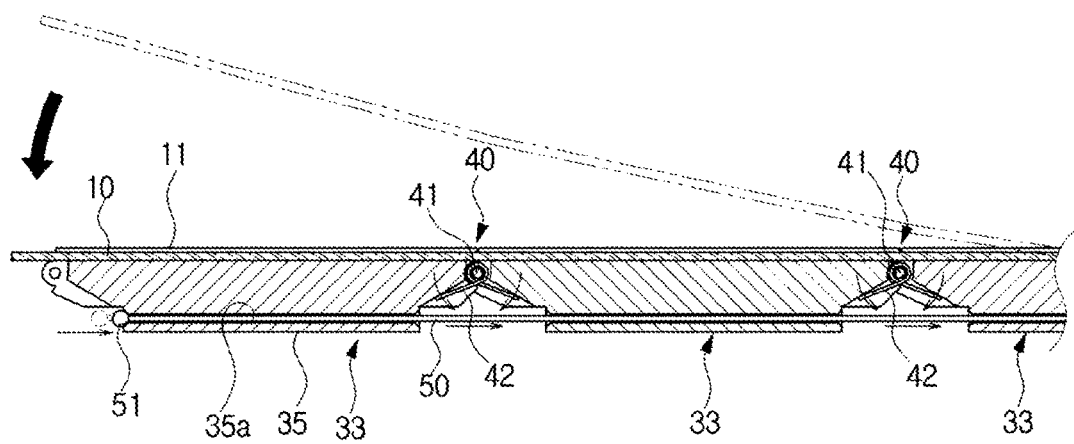
Figure 9:
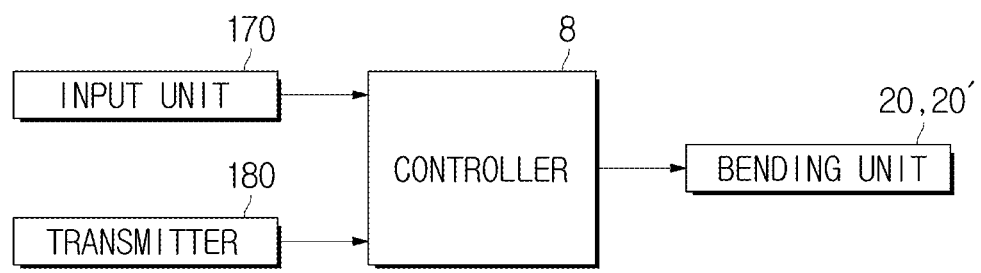
FIG. 9 is a control block diagram illustrating a display apparatus according to an exemplary embodiment.

FIG. 6 is a view schematically illustrating a tension adjuster of a bending structure according to an exemplary embodiment, FIGS. 7 and 8 are views schematically illustrating positions of a display module operated by a tension adjuster of a bending structure according to one or more exemplary embodiments. FIG. 9 is a control block diagram illustrating a display apparatus according to an exemplary embodiment.

The tension adjuster 60 that is configured to adjust the tension of a wire 50 of a bending structure 20 may include a tension adjustment roller 61 connected to the wire 50 such that the wire 50 is wound around the tension adjustment roller 61, and a driver 62 to generate driving force to rotate the tension adjustment roller 61.

The driver 62 may include a first gear 62a formed on the outer circumferential surface of the tension adjustment roller 61, a second gear 62b engaged with the first gear 62a, and a motor 62c to rotate the second gear 62b.

The tension adjustment roller 61 is rotatably installed at one of the support members 34 arranged at the center, and one end of the wire 50 is connected to the tension adjustment roller 61.

The wire 50 may include a first wire 50a extending from one side end of the first link unit 31 to the center of the first link unit 31 at the upper side of the frame 30, a second wire 50b extending from the other side end of the first link unit 31 to the center of the first link unit 31, a third wire 50c extending from one side end of the second link unit 32 to the center of the second link unit 32 at the lower side of the frame 30, and a fourth wire 50d extending from the other side end of the second link unit 32 to the center of the second link unit 32.

One end of each of the first to fourth wires 50a, 50b, 50c and 50d is provided with a wire holding portion 51 having a larger diameter than the wire conduit 35a of the link members 33.

Accordingly, when the first to fourth wires 50a, 50b, 50c and 50d are pulled by the tension adjuster 60, the wire holding portion 51 formed at an end of the wire 50 is interrupted by the wire conduit 35a such that the display module 10 connected to the link members 33 is pulled. Thereby, curvature of the display module 10 is changed.

The tension adjustment roller 61 may be rotatably installed below the center of the support member 34 of the frame 30.

In addition, the first wire 50a and the second wire 50b, which are connected to the first link unit 31 of the frame 30, are fixed to one side 61a of the tension adjustment roller 61, and the third wire 50c and the fourth wire 50d, which are connected to the second link unit 32 of the frame 30, are fixed to the other side 61b of the tension adjustment roller 61.

The second gear 62b engaged with the first gear 62a of the tension adjustment roller 61 may be connected to the shaft of the motor 62c to rotate the tension adjustment roller 61 according to rotation of the motor 62c and to pull or release the first to fourth wires 50a, 50b, 50c and 50d connected to the tension adjustment roller 61.

The tension adjuster 60 may be disposed at the central portion of the support member 34 of the frame 30.

The tension adjuster 60 may further include a guide roller 52 to guide movement of the first to fourth wires 50a, 50b, 50c and 50d. The guide roller 52 is arranged over and under the support member 34 disposed at the central portion. The guide roller 52 may include a first guide roller 52a to guide the first wire 50a and the second wire 50b at the upper side of the frame 30, and a second guide roller 52b to guide the third wire 50c and the fourth wire 50d at the lower side of the frame 30.

A pair of the first guide roller 52a and the second guide roller 52b may be provided to guide the wire.

The driver 62 may further include a controller 8 to control the driving of a motor 62c. Specifically, the controller 8 may control the number of rotations of the motor 62c such that the curved angle of the display module 10 is changed in a wide range by tension of the wire 50.

Hereinafter, a description will be given of operation of the bending structure 20 to change the display module 10 of the display apparatus 1 selectively to the flat surface form or the curved surface form as shown in FIGS. 7 and 8.

According to an exemplary embodiment, the display module 10 may be usually operated in the curved surface form.

The curved surface form of the display module 10 may be maintained by the elastic member 42 which is installed at the hinge shaft 41 connecting the link members 33, which are arranged on the rear surface of the display module 10.

Specifically, the elastic member 42 installed at the hinge shaft 41 rotatably connecting the link members 33 to each other applies a forward force on the display module 10 such that the link members 33 are connected, forming a predetermined angle.

With link members 33 connected to each other as described above allows the display module 10 to be arranged in the curved surface form in which both side ends of the display module 10 protrude forward relative to the middle of the display module 10 such that the display module 10 forms a concave shape. According to another exemplary embodiment, the middle may protrude forward relative to the ends in a convex shape.

The first to fourth wires 50a, 50b, 50c and 50d are not tensioned although the first and second wires 50a and 50b are connected to the first link unit 31, and the third and fourth wires 50c and 50d are connected to the second link unit 32.

When a user provides an input indicating a transition, for example by manipulating a switch or a remote control, to arrange the display module 10 in the flat surface form, the motor 62c of the tension adjuster 60 is caused to rotate, and the second gear 62b connected to the shaft of the motor 62c is in turn caused to rotate. Thereby, the first gear 62a and the tension adjustment roller 61 engaged with the second gear 62b rotate.

As the tension adjustment roller 61 rotates, it pulls and tensions the first to fourth wires 50a, 50b, 50c and 50d connected thereto. By the tensional force applied to the wires, both side ends of the display module 10 are arranged to set the display module 10 in the flat surface form.

The display apparatus 1 constructed as above may include a controller 8 to control the display apparatus 1 and the bending structure 20 included in the display apparatus 1 and an input unit 170 such as buttons arranged at the remote control 7 or the display apparatus 1. Thereby, when the user manipulates the input unit 170, the bending structure 20 may set the display module 10 to one of the flat surface form and the curved surface form.

Alternatively, it may also possible to automatically change the display module 10 to the flat surface form or the curved surface form depending upon the kinds of the content to be displayed on the display module 10. For example, when information indicating that the content to be displayed on the display module 10 is news is input to the display apparatus 1, the display module 10 may be set in the flat surface form through the bending structure 20. When information indicating that the content to be displayed on the display module 10 is a movie is input to the display apparatus 1, the display module 10 may be set in the curved surface form through the bending structure 20.

Information about the kinds of content may be input by the user through the input unit 170 provided to the remote control 7 or the display apparatus, or may be received along with an image signal from an image transmitter 180 such as a broadcast station.

Figure 10:
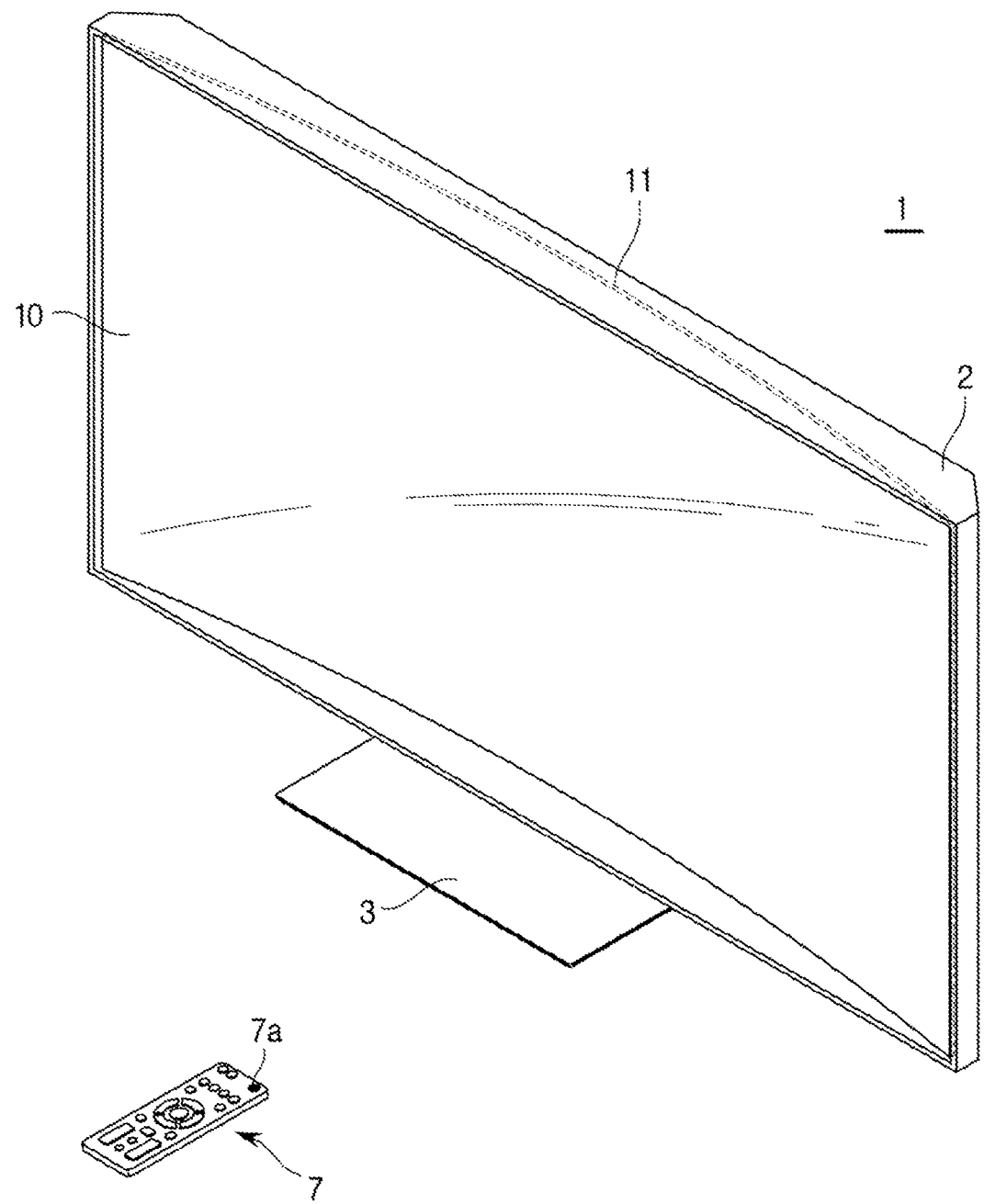
FIG. 10 is a perspective view schematically illustrating a display module of a display apparatus according to another exemplary embodiment, which is set in a curved surface form.
Figure 11:
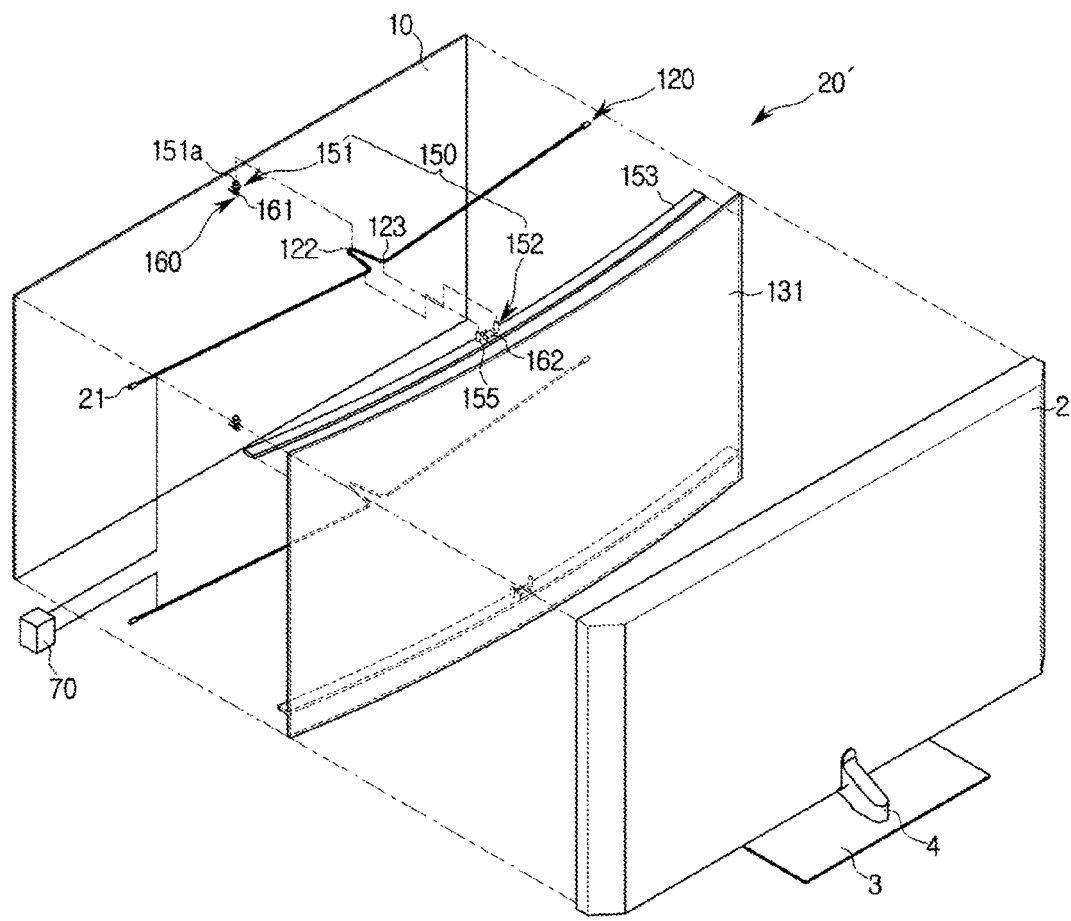
FIG. 11 is an exploded perspective view schematically illustrating a bending structure of a display apparatus according to an exemplary embodiment.
Figure 12:
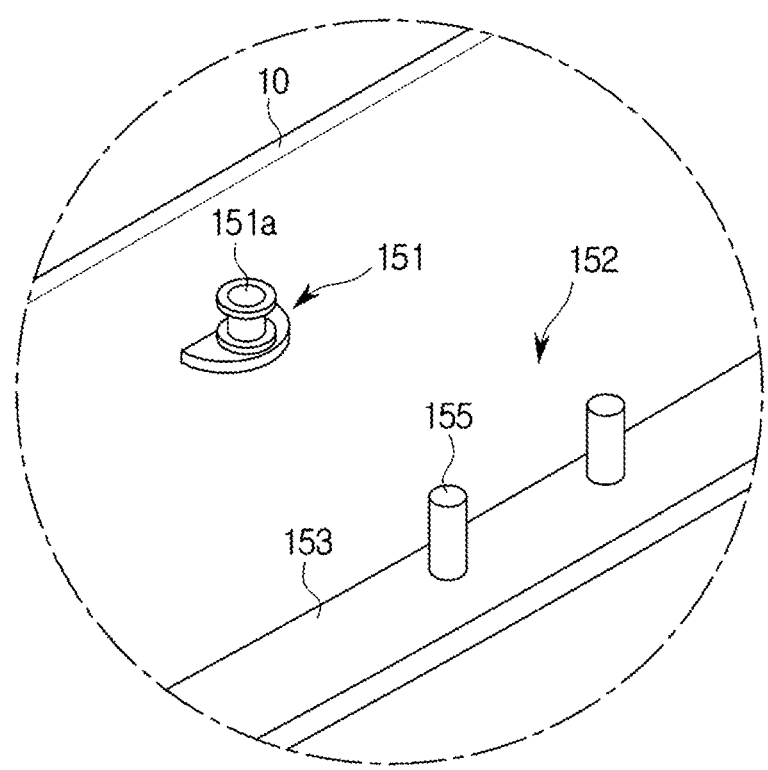
FIG. 12 is a perspective view schematically illustrating a bending structure of a display module according to an exemplary embodiment.
Figure 13:
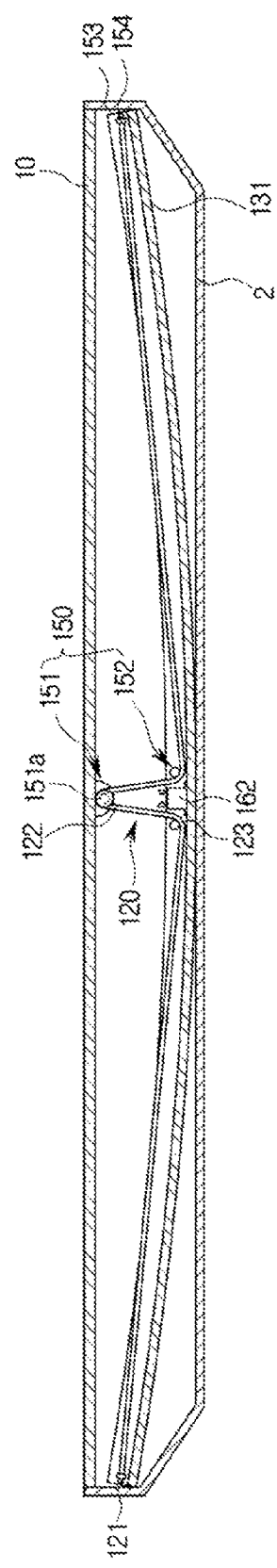
FIG. 13 is a view schematically illustrating a bending structure with a display module arranged in a flat surface form according to an exemplary embodiment.
Figure 14:
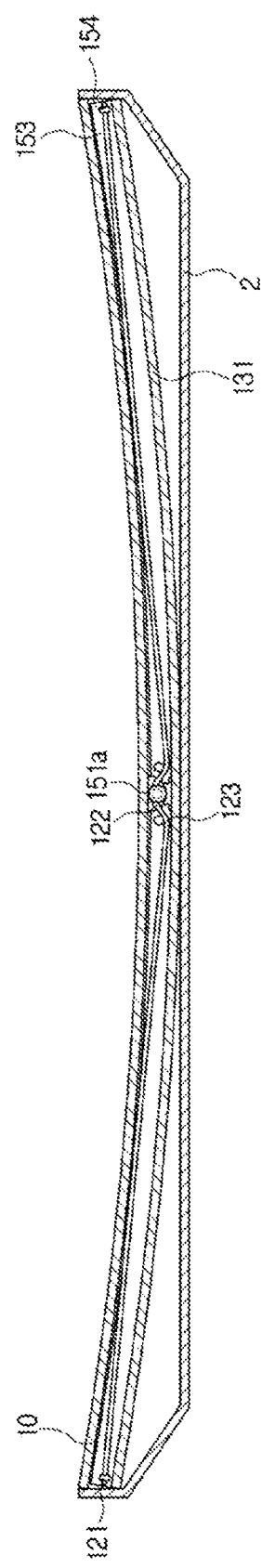
FIG. 14 is a view schematically illustrating a bending structure with a display module set in a curved surface form according to an exemplary embodiment.

FIG. 10 is a perspective view schematically illustrating a display module of a display apparatus according to another exemplary embodiment, which is set in a curved surface form. FIG. 11 is an exploded perspective view schematically illustrating a bending structure of a display apparatus according to an exemplary embodiment. FIG. 12 is a perspective view schematically illustrating the bending structure of the display module according to an exemplary embodiment. FIG. 14 is a view schematically illustrating the bending structure with a display module set in the curved surface form according to an exemplary embodiment.

As shown in FIGS. 10 to 14, a bending structure 20' may be provided between the display module 10 and the case 2 such that both side ends of the display module 10 protrude forward by being positioned further forward than the center of the display module 10. That is, the bending structure 20' is adapted to selectively change the display module 10 to the curved surface form or to the flat surface form by moving the center of the display module 10 backward with respect to both side ends of the display module 10.

The bending structure 20' may be arranged at the back of the display module 10 in order to move the center of the display module 10 backward with respect to both side ends of the display module 10.

The bending structure 20' may include a memory alloy wire 120 expanding and contracting depending upon characteristics of the applied electrical power, a bracket 131 allowing the memory alloy wire 120 to be fixed thereto, and a fixing structure 150 allowing the memory alloy wire 120 to connect the display module 10 to the bracket 131.

The bracket 131 may be formed in the shape of a curved surface having a center recessed backward with respect to both side ends and disposed between the display module 10 and the case 2.

The memory alloy wire 120 exhibits shape memory effect of contracting or recovering its original shape (expanding) depending according to change in temperature caused by supplied current. The memory alloy wire 120 may be formed, for example, of Ni—Ti alloy (nitinol). The memory alloy wire 120 may be formed of any alloy that exhibits the shape memory effect.

The fixing structure 150 may include a first fixing member 151 provided on the rear surface of the display module 10 and a second fixing member 152 provided on the bracket 131.

The first fixing member 151 includes a restricting protrusion 151a protruding upward from the rear surface of the display module 10. The restricting protrusion 151a may be formed in a circular shape such that pulling force caused by contraction of the memory alloy wire 120 is uniformly transmitted to the display module 10.

The second fixing member 152 includes a supporter 153 laterally arranged on the front surface of the bracket 131, fixing portions 154 formed at the bracket 131 such that both ends of the memory alloy wire 120 are fixed to the bracket 131 at both ends of the upper side of the supporter 153, and a guide 155 formed at the center of the bracket 131 to guide movement of the memory alloy wire 120 through flexible deformation.

The supporter 153 may be arranged such that the memory alloy wire 120 is supported by the upper side of the supporter 153. To fix the memory alloy wire 120, the fixing portions 154 may be provided to both side ends of the supporter 153. The guide 155 protruding upward and cylindrically formed may be arranged at the center of the supporter 153.

Stoppers 121 may be formed at both ends of the memory alloy wire 120 to prevent movement of the memory alloy wire 120. While the stoppers 121 are illustrated as circular in this exemplary embodiment, exemplary embodiments are not limited thereto. For example, stoppers 121 may be detachably attached to the memory alloy wire 120 using a separate member.

The fixing portions 154 may be adapted to fix the memory alloy wire 120 at either end of the display and may accomplish this fixing by being provided with a through hole allowing the memory alloy wire 120 to be coupled to the fixing portions 154 therethrough. Herein, the size of the stoppers 121 at the ends of the memory alloy wire 120 may be greater than that of the through hole of the fixing portions 154.

A pair of guides 155 may be disposed on both sides of the center of the supporter 153.

A first restricting portion 122 protruding to be caught by the restricting protrusion of the first fixing member 151 is formed at the center of the memory alloy wire 120.

In addition, the memory alloy wire 120 may include a second restricting portion 123 protruding rearward from the first restricting portion 122. The second restricting portion 123 may be bent from the first restricting portion 122 and extend in both lateral directions.

The first restricting portion 122 and second restricting portion 123 of the memory alloy wire 120 may be rounded to be respectively movably supported by the restricting protrusion 151a and the guide 155, which are cylindrically formed.

The memory alloy wire 120 may be connected to a power source 70 and a switch to receive supplied current. The power source 70 may supply current through the display apparatus 1. The switch may be provided with a semiconductor switching device, thereby being turned on by an external signal applied thereto. Once the switch is turned on, current is supplied to the memory alloy wire 120. When current flows through the memory alloy wire 120, the memory alloy wire 120 contracts. For example, the memory alloy wire 120 contracts by about 50 mm over the entire length.

As the memory alloy wire 120 contracts, the restricting protrusion 151a of the first fixing structure 151 connected to the first restricting portion 122 of the memory alloy wire 120 is pulled toward the bracket 131, and the center of the display module 10 connected to the restricting protrusion 151a moves toward the bracket 131.

On the contrary, when the switch is turned off and current flowing through the memory alloy wire 120 is cut off, heat generated in the memory alloy wire 120 dissipates and the memory alloy wire 120 returns to an original length thereof.

As the memory alloy wire 120 returns to an original length thereof, the display module 10 is released from the pulling force applied by the first restricting portion 122, recovering an original flat surface form thereof.

The bending structure 20' may further include a latch 160 to lock and unlock the display module 10 to maintain the curved surface form of the display module 10 when the memory alloy wire 120 contracts and the display module 10 is set in the curved surface form.

Figure 15:
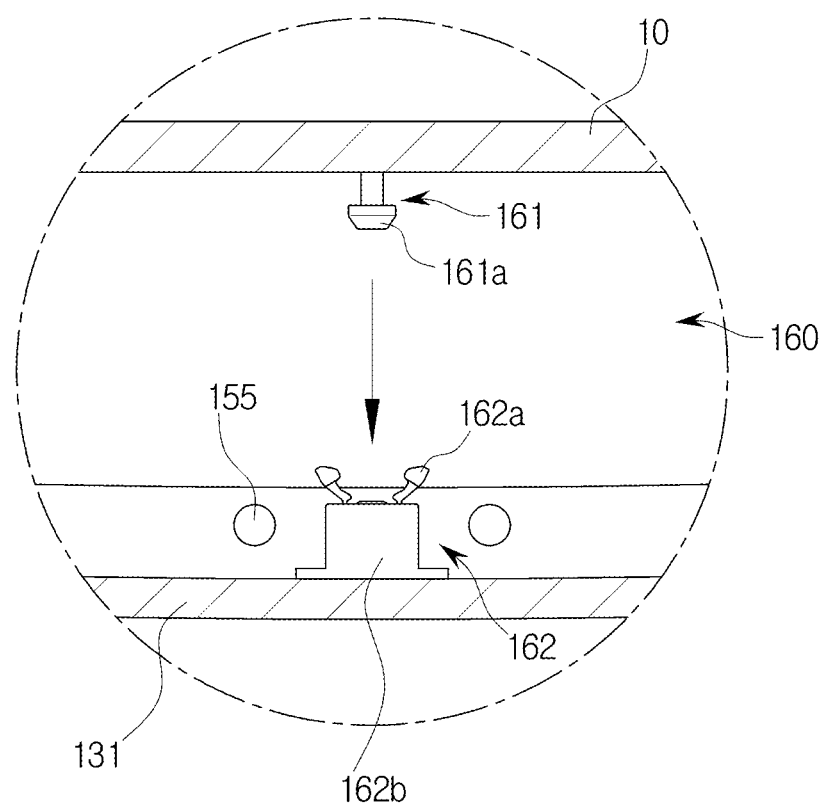
FIGS. 15 and 16 are views schematically illustrating operation of a latch with a display module set in a flat surface form and a curved surface form according to one or more exemplary embodiments.
Figure 16:
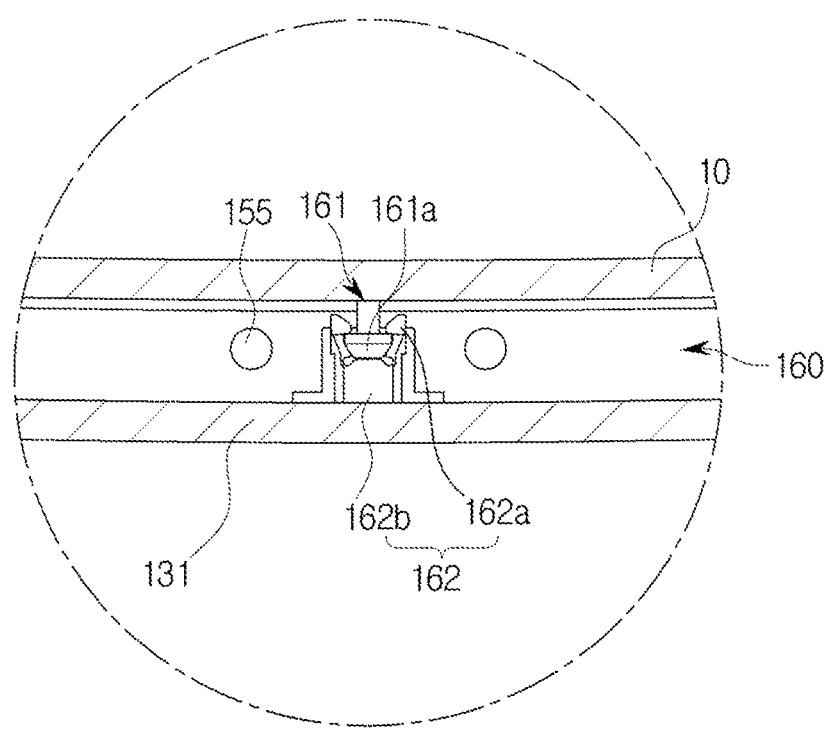

FIGS. 15 and 16 are views schematically illustrating operation of a latch with a display module set in the flat surface form and the curved surface form according to one or more exemplary embodiments.

As shown in FIGS. 15 and 16, the latch 160 includes a protrusion 161 protruding from the rear surface of the display module 10 and a latch 162 to hold or release the protrusion 161.

The protrusion 161 may include a head 161a spreading wide in the shape of a mushroom. The head 161a may be inserted into the latch 162 such that the display module 10 is set in the curved surface form.

The latch 162 provided to the bracket 131 so as to correspond to the protrusion 161 may include a body 162b, and a catch member 162a adapted to be elastically deformed by sliding outward from the interior of the body 162b to hold or release the protrusion 161.

The catch member 162a adapted to be elastically deformed to hold or release the protrusion 161 and the body 162b adapted to slide the catch member 162a, which are not shown in detail, are constituents of a commonly used latch, and a detailed description thereof will be omitted.

As is apparent from the above description, the display module of a display apparatus according to an exemplary embodiment may be selectively arranged in the flat surface form or the curved surface form when used.

In addition, the display module is controllable in a wide range of angles, and therefore the curvature thereof may be varied depending upon the consumer's preference.

In addition, the curvature of the display module arranged in the curved surface form may be accurately controlled. Therefore, the viewing angle may be enhanced.

The display module may include a display panel (for example, a LCD panel and an OLED panel) and a support plate supporting the display panel. When the support plate connected to the frame is bent, the display panel fixed to the support plate will also be bent, thereby bending the overall display module.

Although a few exemplary embodiments have been shown and described, it would be appreciated by those skilled in the art that changes may be made to the exemplary embodiments without departing from the principles and spirit of the invention, the scope of which is defined in the claims and their equivalents.

What is claimed is:

1. A display apparatus comprising:
   a display module that is bendable and is configured to display an image;
   a back cover that surrounds a rear surface and edges of the display module;
   a frame disposed between the display module and the back cover;
   a bending structure configured to deform the display module by moving at least one of a center and both ends of the display module relative to each other to form one of a flat surface form and a curved surface form of the display module; and
   a support member coupled to the frame and configured to support the frame,
   wherein a distance between a center point of the display module and a center point of the back cover is smaller in the curved surface form than in the flat surface form,
   wherein the bending structure further comprises at least one wire configured to connect the display module to the frame and contract and expand according to characteristics of an applied power, and
   wherein the bending structure is disposed between the display module and the back cover and is arranged to cause the display module to bend between the flat surface form and the curved surface form while remaining inside the back cover,
   wherein the frame comprises:
   a link unit comprising a plurality of link members configured to support the rear surface of the display module;
   a plurality of hinges configured to connect the plurality of link members to each other; and
   a plurality of elastic members disposed adjacent to the plurality of hinges and configured to move the plurality of link members into the curved surface form.

2. The display apparatus according to claim 1, wherein the bending structure comprises:
   a tension adjuster configured to adjust tension of the at least one wire.

3. The display apparatus according to claim 2, wherein the bending structure causes the center of the display module to move backward relative to both ends into a concave shape along with the at least one wire into the curved surface form according to decreased tension on the at least one wire.

4. The display apparatus according to claim 2, wherein the bending structure causes the center of the display module to move forward relative to both ends along with the at least one wire from a concave shape into the flat surface form according to increased tension on the at least one wire.

5. The display apparatus according to claim 1, wherein the link unit comprises:
a first link unit arranged laterally along an upper end of the display module; and
a second link unit arranged laterally along a lower end of the display module.

6. The display apparatus according to claim 5, wherein the frame comprises a support member configured to connect the first link unit to the second link unit.

7. The display apparatus according to claim 5, wherein the at least one wire comprises:
a first wire configured to connect a first side end of the first link unit to a center of the first link unit;
a second wire to connect a second side end of the first link unit to the center of the first link unit;
a third wire to connect a third side end of the second link unit to a center of the second link unit; and
a fourth wire to connect a fourth side end of the second link unit to the center of the second link unit.

8. The display apparatus according to claim 2, wherein the tension adjuster comprises:
a tension adjustment roller connected to the at least one wire; and
a driver configured to rotate the tension adjustment roller adjusting tension of the at least one wire.

9. The display apparatus according to claim 8, wherein the driver comprises:
a first gear formed on the tension adjustment roller;
a second gear configured to engage the first gear; and
a motor configured to rotate the second gear.

10. The display apparatus according to claim 2, wherein the tension adjuster further comprises a guide roller configured to guide the at least one wire.

11. The display apparatus according to claim 9, wherein the driver further comprises:
a controller configured to control driving of the motor.

12. The display apparatus according to claim 11, wherein the controller is configured to communicate with a remote control.

13. The display apparatus according to claim 12, wherein the remote control comprises:
a hot key configured to trigger transmission of a signal requesting the display module be deformed.

14. The display apparatus according to claim 1, wherein the bending structure comprises:
a memory alloy wire configured to connect the display module to the frame and contract and expand according to characteristics of an applied power.

15. The display apparatus according to claim 14, wherein the bending structure further comprises:
a bracket arranged at the back of the display module and formed in a curved shape; and
a fixing structure configured to fix a center of the memory alloy wire such that the display module is pulled toward the bracket by flexible deformation of the memory alloy wire.

16. The display apparatus according to claim 15, wherein the fixing structure comprises:
a first fixing member arranged on the rear surface of the display module; and
a second fixing member arranged at the bracket.

17. The display apparatus according to claim 16, wherein the memory alloy wire is connected to the first fixing member and the second fixing member.

18. The display apparatus according to claim 16, wherein the first fixing member comprises a restricting protrusion protruding to allow the memory alloy wire to be fixed thereto.

19. The display apparatus according to claim 16, wherein the second fixing member comprises:
a fixing portion configured to be connected to both ends of the memory alloy wire; and
a guide configured to guide movement of the memory alloy wire through flexible deformation.

20. The display apparatus according to claim 14, wherein the bending structure further comprises a power source connected to the memory alloy wire.

21. The display apparatus according to claim 14, wherein the bending structure further comprises a latch configured to hold the display module in response to the memory alloy wire contracting.

22. The display apparatus according to claim 21, wherein the latch comprises:
a protrusion protruding from the rear surface of the display module.

23. A method of controlling a display apparatus including a display module, a bending structure, a back cover that surrounds a rear surface and edges of the display module, a frame disposed between the display module and the back cover, the frame including a link unit including a plurality of link members configured to support the rear surface of the display module, a hinge unit configured to connect the plurality of link members to each other, and an elastic member disposed between the plurality of link members to elastically support the plurality of link members, a support member coupled to the frame and configured to support the frame and connect the link unit, and at least one wire, connecting the display module to the frame, that contracts and expands according to characteristics of an applied power and a controller, the at least one wire configured to connect the plurality of link members to each other, the method comprising:
switching, using the bending structure, between a flat surface form and a curved surface form, and the bending structure is disposed between the display module and the back cover and is arranged to cause the display module to bend between the flat surface form and the curved surface form while remaining inside the back cover; and
controlling, using the controller, the bending structure, according to a command input by a user,
wherein a distance between a center point of the display module and a center point of the back cover is smaller in the curved surface form than in the flat surface form.

24. The method according to claim 23, further comprising:
receiving the command input for operating the bending structure through a button disposed on one of a remote control and the display apparatus.

25. The method according to claim 24, further comprising:
varying a curvature of the display module in proportion to a pressing time of the button.

26. The method according to claim 24, further comprising:
varying a curvature of the display module stepwise according to a number of times the button is pressed.

27. A method of controlling a display apparatus including a display module, a bending structure, a back cover that surrounds a rear surface and edges of the display module, a frame disposed between the display module and the back cover, a support member coupled to the frame and configured to support the frame, the frame including a link unit including a plurality of link members configured to support the rear surface of the display module, a hinge unit configured to connect the plurality of link members to each other, and an elastic member disposed between the plurality of link members to elastically support the plurality of link members, a support member configured to connect the link unit, and at least one wire, connecting the display module to the frame, that contracts and expands according to characteristics of an applied power and a controller, the method comprising:
determining, using the controller, a content type of an image to be displayed on the display module; and
deforming the display module using the bending structure based on the content type of the image to be displays on the display module, and the bending structure is disposed between the display module and the back cover and is arranged to cause the display module to bend between a flat surface form and a curved surface form while remaining inside the back cover,
wherein the deforming causes a distance between a center point of the display module and a center point of the back cover to be smaller in the curved surface form than in the flat surface form.

28. The method according to claim 27, further comprising:
receiving information about the content type as input from a user.

29. The method according to claim 28, further comprising:
receiving the information about the content type is through a button disposed on one of a remote control and the display apparatus.

30. The method according to claim 27, further comprising:
receiving the information about the content type is along with information about the image from an image transmitter transmitting the image.

31. A display apparatus comprising:
a bendable display module;
a back cover that surrounds a rear surface and edges of the bendable display module;
a frame disposed between the display module and the back cover;
a bending structure attached to the rear surface of the bendable display module configured to deform the bendable display module by causing a distance between a center point of the bendable display module and a center point of the back cover to be smaller in a curved surface form than in a flat surface form; and
a support member coupled to the frame and configured to support the frame,
wherein the bending structure further comprises at least one wire configured to connect the bendable display module to the frame and contract and expand according to characteristics of an applied power, and
wherein the bending structure is disposed between the bendable display module and the back cover and is arranged to cause the bendable display module to bend between the flat surface form and the curved surface form while remaining inside the back cover,
wherein the frame comprises:
a link unit comprising a plurality of link members configured to support a rear surface of the bendable display module;
a plurality of hinges configured to connect the plurality of link members to each other; and
a plurality of elastic members disposed adjacent to the plurality of hinges and configured to move the plurality of link members into the curved surface form.

32. The display apparatus of claim 31, wherein the bending structure is configured to deform the bendable display module by applying a deformation force to at least one of a center and both ends of the bendable display module.

33. The display apparatus of claim 31,
wherein the bending structure comprises a plurality of links with hinges, and
wherein the bending structure is configured to bend the bendable display module between a concave or convex shape and a flat shape when the at least one wire is shortened.

34. The display apparatus of claim 31,
wherein the bending structure comprises a memory alloy wire, and
wherein the bending structure is configured to deform the bendable display module between a flat shape and a concave or convex shape when the memory alloy wire is shortened.

* * * * *